United States Patent [19]

Namiki et al.

[11] Patent Number: 5,288,379

[45] Date of Patent: Feb. 22, 1994

[54] MULTI-CHAMBER INTEGRATED PROCESS SYSTEM

[75] Inventors: Minoru Namiki; Nobuyuki Takahashi, both of Fuchu, Japan

[73] Assignee: Anelva Corporation, Fuchu, Japan

[21] Appl. No.: 979,255

[22] Filed: Nov. 20, 1992

[30] Foreign Application Priority Data

Dec. 4, 1991 [JP] Japan .................................. 3-347738

[51] Int. Cl.$^5$ .................... C23C 14/34; B65G 49/05
[52] U.S. Cl. ................ 204/192.12; 204/298.25; 204/298.35; 118/719; 414/217
[58] Field of Search ............ 204/192.12, 192.32, 204/298.25, 298.35; 118/719, 729; 414/217

[56] References Cited

U.S. PATENT DOCUMENTS

| | | | |
|---|---|---|---|
| 4,405,435 | 9/1983 | Tateishi et al. | 204/298 |
| 4,433,951 | 2/1984 | Koch et al. | 414/217 |
| 4,553,069 | 11/1985 | Purser | 315/111.81 |
| 4,654,106 | 3/1987 | Davis et al. | 156/345 |
| 4,657,620 | 4/1987 | Davis et al. | 156/345 |
| 4,666,366 | 5/1987 | Davis | 414/749 |
| 4,705,951 | 11/1987 | Layman et al. | 250/442.1 |
| 4,715,921 | 12/1987 | Maher et al. | 156/345 |
| 4,730,976 | 3/1988 | Davis et al. | 414/749 |
| 4,764,076 | 8/1988 | Layman et al. | 414/217 |
| 4,796,562 | 1/1989 | Brors et al. | 118/725 |
| 4,813,846 | 3/1989 | Helms | 414/744.1 |
| 4,816,116 | 3/1989 | Davis et al. | 156/643 |
| 4,877,757 | 10/1989 | York et al. | 437/235 |
| 4,909,701 | 3/1990 | Hardegen et al. | 414/749 |
| 4,932,357 | 6/1990 | Tamura et al. | 118/715 |
| 4,951,601 | 8/1990 | Maydan et al. | 118/719 |
| 4,966,519 | 10/1990 | Davis et al. | 414/786 |
| 4,990,047 | 2/1991 | Wagner et al. | 414/217 |
| 5,013,385 | 5/1991 | Maher et al. | 156/345 |
| 5,046,992 | 1/1991 | Tamai et al. | 474/84 |
| 5,067,218 | 11/1991 | Williams | 29/25.01 |
| 5,076,205 | 12/1991 | Vowles et al. | 118/719 |
| 5,102,495 | 4/1992 | Maher et al. | 156/643 |
| 5,186,594 | 2/1993 | Toshima et al. | 204/298.25 X |
| 5,186,718 | 2/1993 | Tepman et al. | 29/25.01 |

FOREIGN PATENT DOCUMENTS

| | | |
|---|---|---|
| 61-231738 | 10/1986 | Japan . |
| 3-136779 | 6/1991 | Japan . |
| 3-154791 | 7/1991 | Japan . |
| 5-21579 | 1/1993 | Japan . |
| 84/03196 | 8/1984 | World Int. Prop. O. . |
| 87/07309 | 12/1987 | World Int. Prop. O. . |
| 91/07773 | 5/1991 | World Int. Prop. O. . |

OTHER PUBLICATIONS

IBM Technical Disclosure Bulletin vol. 29, No. 1 Jun. 1986 pp. 95-96.
Solid State Technology, Advertisement, Jan. 1983, p. 143.
Catalogue of CVC Products, CVC 611 LOADLOK Deposition System, Apr. 1991.
Brian Hardegen et al. "Wafer Transport Innovations for Multi-process Integration", Technical Proceedings of Semicon/West May 1985, pp. 51-57.

*Primary Examiner*—Nam Nguyen
*Attorney, Agent, or Firm*—Burns, Doane, Swecker & Mathis

[57] ABSTRACT

A vacuum processing apparatus capable of quickly replacing a substrate without opening the two gate valves simultaneously by using two waiting stages and a single transferring robot. The transferring robot is designed to transfer a substrate in a straight-line direction, and those two holding stages are set up in front of and behind the center of rotation of the baseplate of the transferring robot. An integrated module multi-chamber vacuum processing system is provided including a plurality of processing chambers capable of being vacuum evacuated, a substrate transferring chamber capable of being vacuum evacuated, at least one load-lock chamber capable of being vacuum evacuated, a substrate transferring robot assembly for transferring a substrate between the at least one load-lock chamber and the processing chamber disposed within the substrate transferring chamber. The substrate transferring robot assembly comprises a baseplate rotatable with respect to the substrate transferring chamber, two waiting stages integrated on the baseplate to store the substrate temporarily, and a substrate transferring robot mounted on the baseplate for transferring the substrate.

16 Claims, 4 Drawing Sheets

MULTI-CHAMBER INTEGRATED PROCESS SYSTEM

BACKGROUND OF THE INVENTION

Field of the Invention

The present invention relates to an integrated module multi-chamber vacuum processing system provided with a substrate transferring robot assembly for transferring a substrate between a load-lock chamber and processing chamber or between processing chambers.

Background Art

For a substrate multi-step vacuum processing system in which thin film is deposited on a substrate and the thin film on the substrate is etched in a vacuum chamber, a load-lock type multi-step vacuum system, in which the processing chambers are not exposed to atmosphere, has been widely used. FIG. 4 is a plan sectional view of a conventional multi-chamber type sputtering system provided with many processing chambers. This system consists of four processing chambers 1, two load-lock chambers 2, and the substrate transferring chamber 3. Substrate transferring chamber 3 has a substrate transferring device 4, whereby a substrate is transferred between a load-lock chamber 2 and a processing chamber 1, or between the processing chambers 1.

In general, with respect to the operation of exchanging a processed substrate with an unprocessed one, the working procedures are as follows. The gate valve 1a of one of the processing chambers 1 and the gate valve 2a of one of the load-lock chambers 2 are opened. A processed substrate is taken out of the processing chamber 1 by substrate transferring device 4, and returned to the load-lock chamber 2. A new unprocessed substrate is then taken out of the load-lock chamber 2 and put into the processing chamber 1. If the operation is performed according to these procedures, the processing chamber 1 will communicate with the load-lock chamber 2 through the substrate transferring chamber 3, thus increasing the risk that dust particles contaminate the space within the processing chamber 1.

To attempt to resolve this problem, it is possible to perform the operation so that these two gate valves, 1a and 2a, are not opened simultaneously. In other words, only the gate valve 1a of the processing chamber 1 is opened to take out the substrate, and the gate valve 1a of the processing chamber 1 is closed before the gate valve 2a of the load-lock chamber 2 is opened to return the processed substrate into the load-lock chamber 2. Thereafter, a new unprocessed substrate is taken out of the load-lock chamber 2, and then the gate valve 2a of the laod-lock chamber 2 is closed. Then, the gate valve 1a of the processing chamber 1 is opened again to transfer a new unprocessed substrate into the processing chamber 1. By using this working procedure, these two gate valves, 1a and 2a, cannot be opened at the same time.

However, this working procedure increases the time required to exchange the substrates, thus high production throughputs can not be maintained. Thus, to exchange the substrates in a short time without opening the two gate valves, it is known to provide two transferring robots in the substrate transferring chamber. FIG. 4 shows this type of substrate transferring device 4 provided with two transferring robots 4a and 4b.

A working procedure for exchanging the substrates with the substrate transferring device 4 of FIG. 4 is as follows. While a substrate is being processed in one of the processing chambers 1, the first transferring robot 4a takes a new substrate 5a out of the load-lock chambers 2, and stands by in the substrate transferring chamber 3. Then, after the processing of the substrate is completed and the gate valve 1a of the processing chamber 1 is opened, a second transferring robot 4b takes the processed substrate 5b out of the processing chamber 1. Immediately after that, the transferring robot 4a transfers a new substrate 5a into the processing chamber 1 to close the gate valve 1a. Then, while the substrate is being processed in the processing chamber 1, the second transferring robot 4b returns the processed substrate 5b into one of the load-lock chambers 2, and at the same time, the first transferring robot 4a takes a new substrate out of the load-lock chamber 2. This working procedure enables an enhancement in the productivity without opening the two gate valves, 1a and 2a, simultaneously.

The conventional substrate transferring mechanism, as shown in FIG. 4, is designed so that the productivity is not decreased without opening the two gate valves simultaneously by the use of two transferring robots. However, a disadvantage results because this structure requires movable parts which generate much more dust particles. Also, it is necessary to enlarge the space within the substrate transferring chamber to contain the two transferring robots in it. As a result, the capability to evacuate the processing chamber must be increased, and the area occupied by the whole system will also be larger.

SUMMARY OF THE INVENTION

It is an object of the present invention to provide a integrated module multiple chamber vacuum processing system provided with a substrate transferring robot assembly, in which two gate valves are not open simultaneously, which maintains high productivity while using only one substrate transferring robot.

According to an embodiment of the present invention, an integrated module multiple chamber vacuum processing system is provided with at least one processing chamber capable of being vacuum evacuated, a substrate transferring chamber capable of being vacuum evacuated, and a load-lock chamber capable of bring vacuum evacuated, a substrate transferring robot assembly for reversibly transferring a substrate between the load-lock chamber and the processing chamber is set up within the substrate transferring chamber, and the aforesaid substrate transferring robot assembly includes a rotatable baseplate mounted within the substrate transferring chamber, two waiting stages integrated on the baseplate wait for the substrate temporarily, and a single transferring robot mounted to the baseplate for reversibly transferring the substrate.

According to one embodiment of the present invention, a substrate mechanical hand of the transferring robot can move along a straight line between the center of rotation of the baseplate and processing chamber, and the two waiting stages are located at a position nearer the processing chamber from the center of rotation of the baseplate, and at a position farther away from the processing chamber on the straight line.

According to one embodiment of the present invention, the transferring robot assembly is characterized in that it consists of a pair of first arms rotatable with respect to the baseplate, a pair of second arms rotating and coupled to the fore-end of each of the first arms, and the substrate mechanical hand coupled to the fore-ends of these second arms. The arms are constructed so that the length of the first arm is equal to the length of the second arm, and the ratio of the angle of rotation of the first arm with respect to the baseplate to the angle of rotation of the second arm with respect to the first arm is 1 to 2.

According to one embodiment, two waiting stages and a single transferring robot assembly are utilized to enable exchanging of substrates quickly without opening the two gate valves simultaneously. In the exchange of a processed substrate, after the gate valve of the processing chamber opens, the transferring robot takes the processed substrate out to put it onto the first waiting stage. Then, the same transferring robot transfers a new substrate placed on the second waiting stage into the processing chamber and the gate valve closes. While the substrate is being processed in the processing chamber, the processed substrate placed on the first waiting stage is returned to the load-lock chamber by the transferring robot, and a new, unprocessed substrate is removed from the load-lock chamber to be placed on the second waiting stage. Thus, the substrate can be exchanged in a short time by a single transferring robot.

According to one embodiment, a substrate is moved in a straight line by the transferring robot, and two waiting stages are set up at a position nearer the processing chamber than the center of rotation of the baseplate, and at a position farther away from the processing chamber, respectively. During the changing operation, a substrate being held by the transferring robot while the gate valve of the processing chamber or the load-lock chamber is opened, can be moved quickly because the substrate is basically allowed to make only a straight line movement. In this case, if the structure is arranged so that two waiting stages in the space are provided between the center of rotation of the baseplate and the processing chamber, the distance between the center of rotation of the baseplate and processing chamber becomes longer; thus leading to the problem in which the area occupied for the substrate transferring robot assembly will be larger. In contrast, according to the present invention, the area occupied for the substrate transferring robot assembly requires only a small area due to the provision of the waiting stages in front of and behind the center of rotation of the baseplate respectively.

According to one embodiment, the length of the first arm is set equal to that of the second arm, and the ratio of the angle of rotation of the first arm with respect to the baseplate to the angle of rotation of the second arm with respect to the first arm is set at 1 to 2 to thereby enabling straight-line movement of the substrate mechanical hand.

DETAILED DESCRIPTION OF THE PREFERRED EMBODIMENTS

Figure 1:
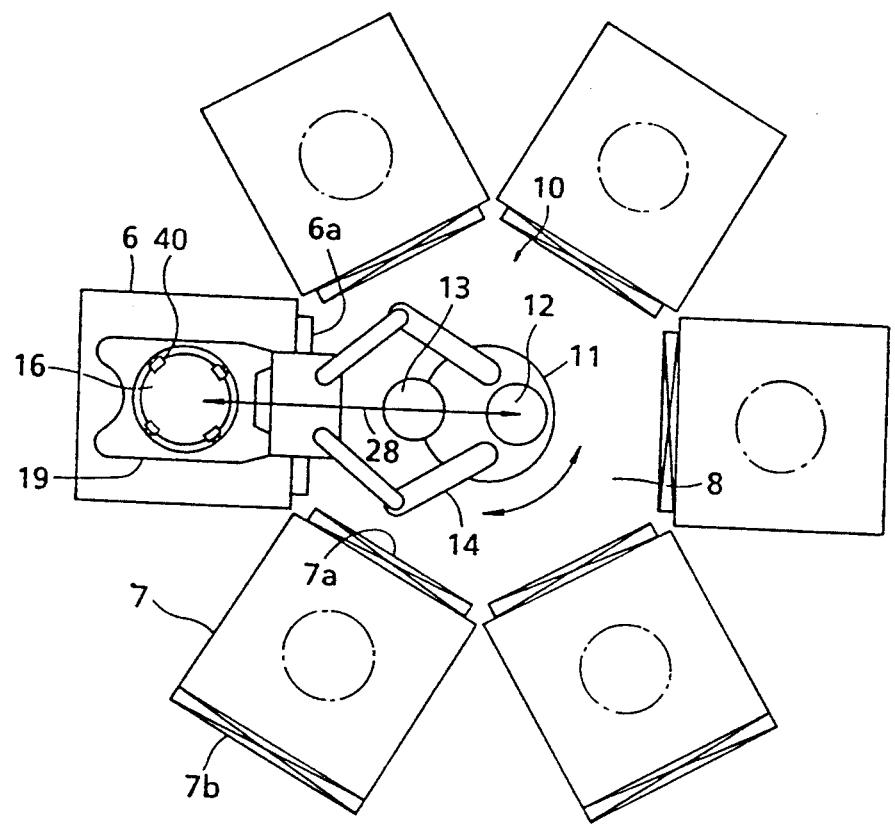
FIG. 1 is a plan sectional view of the construction according to the present invention.

The present invention will hereafter be described with respect to the types of construction shown in the drawings.

FIG. 1 is a plan sectional view of the construction according to one embodiment of the present invention. This system is a multi-chamber system for sputtering equipped with many processing chambers. The multi-chamber sputtering system consists of four processing chambers 6, two load-locks chamber 7, and a substrate transferring chamber 8. Each of the processing chambers 6, the load-lock chambers 7 and the substrate transferring chamber 8 are capable of being independently vacuum evacuated. Within the substrate transferring chamber 8, a substrate transferring robot assembly 10 is set up, which has a rotating baseplate 11, two waiting stages 12 and 13, and a frog-leg type articulated robot 14.

The basic substrate transferring procedure for the sputtering system will be described first. The following working procedure allows a new substrate to stand by within the substrate transferring chamber 8.

(a) After one of the load-lock chambers 7 is exposed to the atmosphere, the gate valve 7b is opened to transfer to a substrate into the load-lock chamber 7.

(b) Then, the gate valve 7b is closed to evacuate the load-lock chamber 7.

(c) Next, the baseplate 11 of the substrate transferring robot assembly 10 rotates so that the frog-leg type articulated robot 14 within the substrate transferring chamber 8 faces the load-lock chamber 7.

(d) The gate valve 7a of the load-lock chamber 7 is opened, the substrate is taken out of the load-lock chamber 7 by the substrate mechanical hand 19 of the frog-leg type articulated robot 14 and placed on the first waiting stage 12. The gate valve 7a is then closed.

(e) Then, the baseplate 11 is rotated so that the frog-leg type articulated robot 14 is directed toward one of the processing chambers 6. By the foregoing operation, a new substrate is placed in a stand-by state within the substrate transferring chamber 8. At this time, the substrate mechanical hand 19 of the frog-leg type articulated robot 14 is not holding any substrates.

Next, the procedure of exchanging a processed substrate with a new one will be described.

(a) After a thin film depositing process by sputtering is completed in the processing chamber 6, the gate valve 6a of the processing chamber 6 is opened to take out the processed substrate 16 by the use of the substrate mechanical hand 19 of the frog-leg type articulated robot 14.

(b) After placing the removed substrate 16 on the second waiting stage 13, the new substrate placed on the first waiting stage 12 is grasped by the substrate mechanical hand 19 and transferred into the processing chamber 6.

(c) The gate valve 6a is then closed.

(d) While the thin film is being deposited in the processing chamber 6, the baseplate 11 is rotated so that frog-leg type articulated robot 14 is directed toward the load-lock chamber 7.

(e) Then, the gate valve 7a of the load-lock chamber 7 is opened, and the processed substrate placed on the second waiting stage 13 is transferred into the load-lock chamber 7.

(f) Then, a new substrate is taken out of the load-lock chamber 7 and placed on the first waiting stage 12, and the gate valve 7a is closed.

(g) Finally, the baseplate 11 is rotated to direct the frog-leg type articulated robot 14 toward the processing chamber 6 in a stand-by state again.

Figure 2:
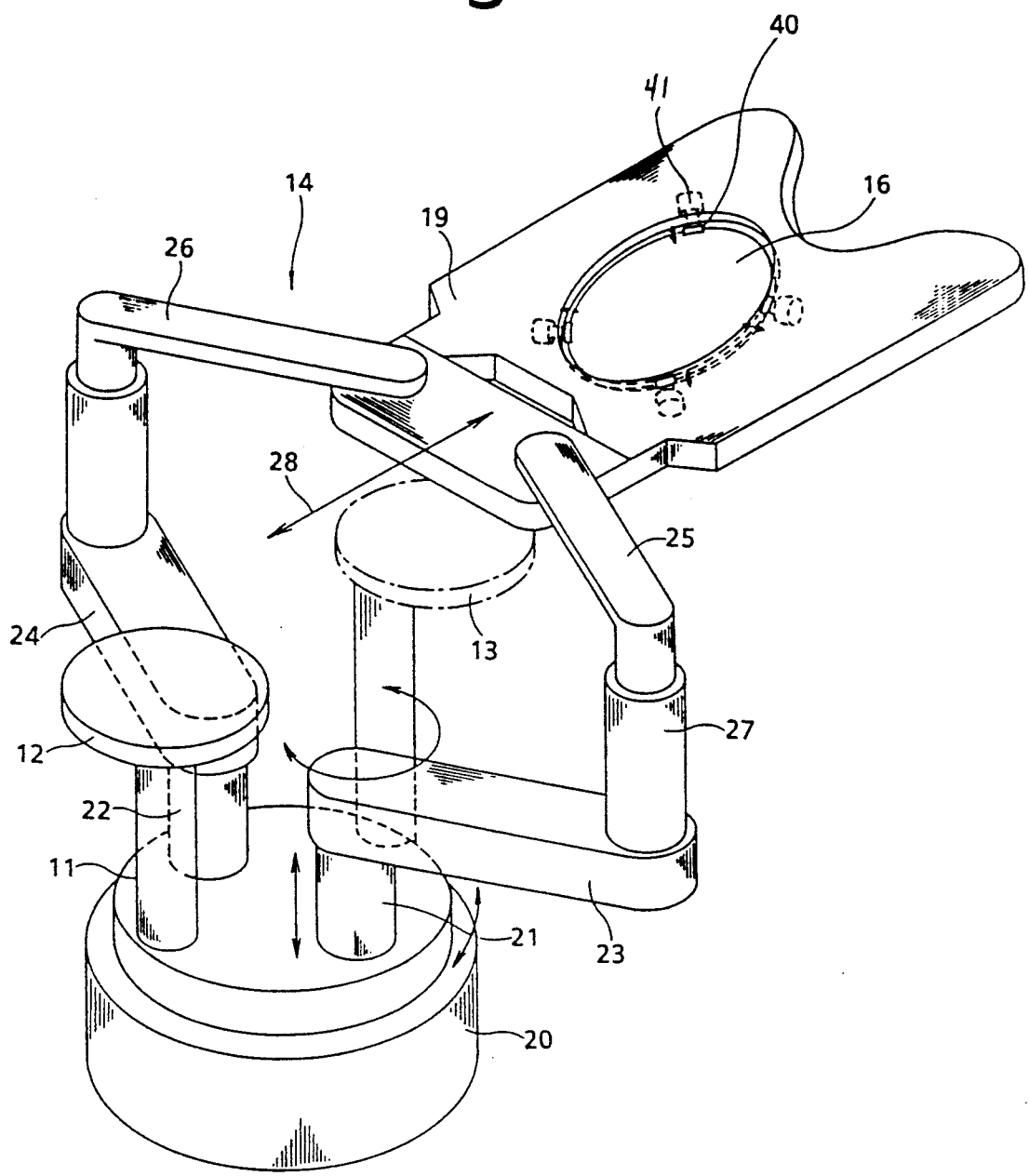
FIG. 2 is a perspective view of the substrate transferring robot assembly.

Furthermore, the structure of the substrate transferring robot assembly 10 will be described in detail. FIG. 2 is a perspective view of the substrate transferring robot assembly 10. The baseplate 11 is rotatably mounted to the substrate transferring chamber through a magnetic fluid sealing device 20. The frog-leg type articulated robot 14 consists of the baseplate 11, the shafts 21 and 22, the first arms 23 and 24, the second arms 25 and 26, and the substrate mechanical hand 19. Two shafts 21 and 22 are mounted to the baseplate 11. These shafts 21 and 22 are mounted in such a manner so as to be rotatable and movable vertically relative to the baseplate 11. First arms 23 and 24 are coupled to the shafts 21 and 22, respectively, and second arms 25 and 26 are further coupled to these first arms 23 and 24, respectively. Since the structures of the shafts and arms are symmetrical in the left and right directions, only the structure of one side will be described as follows. The top-end of the shaft 21 is coupled to the termination portion of the first arm 23. The vertical portion 27 stands vertically at the fore-end of the first arm 23, and the second arm 25 is rotatably mounted to the vertical portion 27. The fore-end of the second arm 25 is rotatably mounted to the substrate mechanical hand 19.

At an intermediate height position, between the height position of the horizontal portion of the first arm 23 and that of the mechanical hand 19, two waiting stages 12 and 13 are set up. The substrate mechanical hand 19 is designed to move on a straight line in the directions of the arrow 28 as described later, and two waiting stages 12 and 13 are set up along this straight locus as viewed from above. The first waiting stage 12 is set up behind with respect to the retract direction of the substrate mechanical hand 19, the center of rotation of the baseplate 11, and the second waiting stage 13 is set up in front with respect to the advance direction of the substrate mechanical hand 19 of the center of rotation of the baseplate 11.

The substrate mechanical hand 19 has, on the lower face side, a mechanism for chucking the substrate. In the present construction, four pawls 40 for advancing and retracting by the operation of an electromagnetic actuator 41, such as a solenoid actuator are provided, and these pawls serve to support the side edges of the substrate. On the pawl, there is formed a groove into which the substrate 16 can be inserted. Thereby, when the four pawls 40 advance, the substrate 16 can be held, while when they retract, the substrate 16 can be released. To grasp or release the substrate 16 on the waiting stage 12 or 13, the substrate mechanical hand 19 is allowed to move right above the waiting stage 12 or 13, and the substrate mechanical hand 19 is lowered from the ordinary substrate transferring position to set the substrate 16 on the waiting stage 12 or 13. To move the substrate mechanical hand 19 up and down, the shafts 21 and 22 in FIG. 2 are moved vertically.

In the present construction, it is shown that the substrate mechanical hand 19 can hold only one substrate, but the substrate mechanical hand 19 can be designed to hold a plurality of substrates. If, for example, another substrate mechanical hand having the same mechanism as the substrate mechanical hand 19 is mounted behind the substrate mechanical hand 19 toward the waiting stage 12 in the directions of the arrow 28 in FIG. 2, two substrates can be held.

Figure 3:
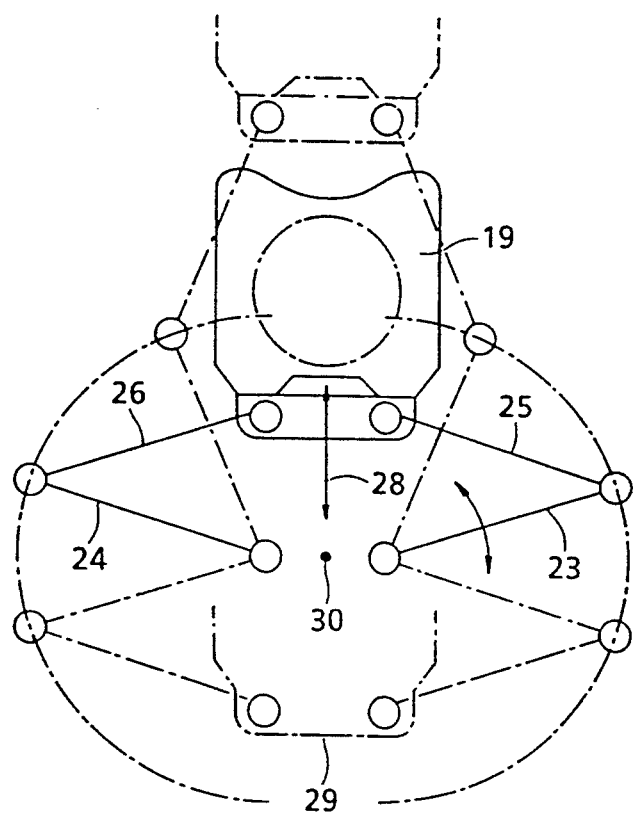
FIG. 3 is a plan view showing the operational principle of the transferring articulated robot arm assembly.
Figure 4:
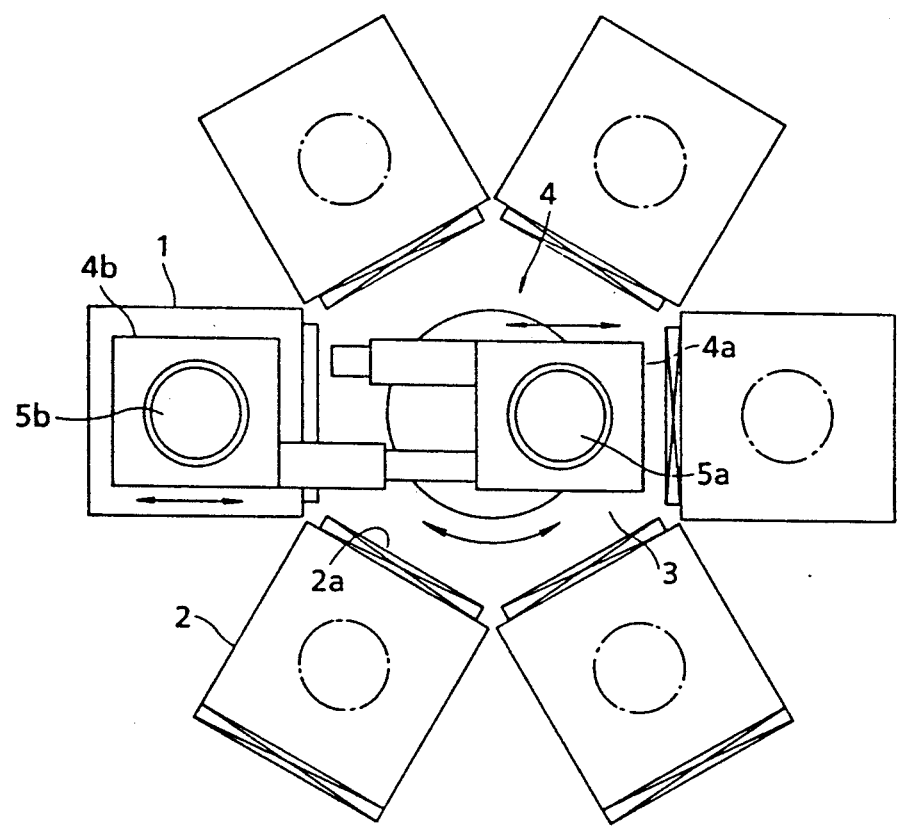
FIG. 4 is plan sectional view of the conventional multiple chamber system.

FIG. 3 is a plan view illustrating the operation of the frog-leg type articulated robot 14. The structure is arranged so that the length of the first arms 23, 24 is equal to that of the second arms 25, 26, and the angle of rotation of the second arms 25, 26 with respect to the first arms 23, 24 is always twice as much as the angle of rotation of the first arms 23, 24 with respect to the baseplate. Accordingly, when the first arms 23, 24 rotate, the fore-ends of the second arms 25, 26 move in a straight line. The substrate mechanical hand 19 makes a straight-line motion while maintaining its posture because it is coupled to the fore-ends of the two second arms 25 and 26. In other words, when the first arms 23 and 24 are rotated in a first direction, as shown in solid lines in FIG. 3, the substrate mechanical hand 19 moves upward, while when the first arms are rotated in an opposite direction, the substrate mechanical hand 19 moves downward as shown in dashed-dotted lines in FIG. 3. When the first arms 23 and 24 are rotated in said opposite direction, the substrate mechanical hand 19 can retract from the center of rotation 30 of the base as shown by an imaginary line 29. The substrate mechanical hand 19 moves along a straight line between the first and second waiting stages and the processing and load-lock chambers for moving substrates therebetween.

In this respect, to ensure that the angle of rotation of the second arms 25, 26 with respect to the first arms 23, 24 is always twice as much as the angle of rotation of the first arms 23, 24 with respect to the baseplate, several appropriate mechanisms may be used, such as a gear train in which the gear ratio of the first stage gear to the final stage gear is 2 to 1, or a belt driving unit using pulleys with the same diameter ratio.

The present invention is not limited to the multi-chamber sputtering system described in the above-mentioned construction, but can be applied to various processes such as chemical vapor deposition, dry etching and the like, of a type for processing a substrate in vacuum.

According to one embodiment of the present invention, the apparatus is capable of quickly exchanging substrates without opening the two gate valves simultaneously by the use of two waiting stages and the single transferring robot assembly.

According to one embodiment of the present invention, the apparatus is capable of quickly exchanging substrates without moving the substrate uselessly because the substrate transferring mechanism is a type designed to be moved in a straight line direction by the frog-leg type transferring robot. Also, since two waiting stages are integrated in front of and behind the center of rotation of the baseplate, the substrate transferring robot assembly occupies a smaller area.

According to one embodiment of the present invention, the length of the first arm is equal to that of the second arm and the ratio of the angle of rotation of the first arm with respect to the baseplate, to the angle of rotation of the second arm with respect to the first arm, is 1 to 2, thereby enabling converting a rotary driving force exerted from the outside into a straight-line motion of substrate mechanical hand by a very simple structure.

Of course, concerning the preferred construction as described above, those skilled in this technical field will be able to understand that various variations and modifications could be made. Accordingly, these variations and modifications do not deviate from the idea and range of the invention defined in the attached claims.

What is claimed is:

1. An integrated module multi-chamber vacuum processing system comprising:
   a plurality of processing chambers capable of being vacuum evacuated;
   a substrate transferring chamber capable of being vacuum evacuated;
   at least one load-lock chamber capable of being vacuum evacuated;
   a substrate transferring robot assembly for transferring a substrate between the at least one load-lock chamber and the processing chamber disposed within the substrate transferring chamber;
   the substrate transferring robot assembly comprising:
      a baseplate rotatable with respect to the substrate transferring chamber;
      two waiting stages integrated on the baseplate to store the substrate temporarily; and
      a substrate transferring robot mounted on the baseplate for transferring the substrate.

2. An integrated module multi-chamber vacuum processing system according to claim 1, wherein the substrate transferring robot comprises a substrate mechanical hand moveable along a straight line between the center of rotation of the baseplate and the processing chamber, and the two waiting stages are integrated at a position nearer the processing chamber than the center of rotation of the baseplate, and at a position farther away from the processing chamber on the straight line.

3. An integrated module multi-chamber vacuum processing system according to claim 2, wherein the substrate transferring robot comprises a pair of first arms rotatable with respect to the baseplate, a pair of second arms rotatably coupled to a fore-end of each of the first arms, and a substrate mechanical hand coupled to fore-ends of the second arms, and wherein the length of the first arm is equal to the length of the second arm, and the ratio of the angle of rotation of the first arm with respect to the baseplate to the angle of rotation of the second arm with respect to the first arm is 1 to 2.

4. An integrated module multi-chamber vacuum processing system according to claim 3, further comprising pawls disposed on one surface of the substrate mechanical hand which advance and retract by the operation of an electromagnetic actuator.

5. An integrated module multi-chamber vacuum processing system according to claim 4, wherein the substrate transferring robot is a frog-leg type articulated robot.

6. In an integrated module multi-chamber vacuum processing system including a plurality of processing chambers capable of being vacuum evacuated, a substrate transferring chamber capable of being vacuum evacuated, at least one load-lock chamber capable of being vacuum evacuated, a substrate transferring robot assembly for transferring a substrate between the at least one load-lock chamber and the processing chamber, the substrate transferring robot assembly comprising:
   a baseplate rotatable with respect to the substrate transferring chamber;
   two waiting stages integrated on the baseplate to store the substrate temporarily; and
   a substrate transferring robot mounted on the baseplate for transferring the substrate.

7. In the integrated module multi-chamber vacuum processing system according to claim 6, the substrate transferring robot assembly being disposed within the substrate transferring chamber and further comprising a substrate mechanical hand moveable along a straight line between the center of rotation of the baseplate and the processing chamber, and the two waiting stages are integrated at a position nearer the processing chamber than the center of rotation of the baseplate, and at a position farther away from the processing chamber on the straight line.

8. In the integrated module multi-chamber vacuum processing system according to claim 7, the substrate transferring robot assembly being disposed within the substrate transferring chamber and further comprising a pair of first arms rotatable with respect to the baseplate, a pair of second arms rotatably coupled to a fore-end of each of the first arms, and a substrate mechanical hand coupled to fore-ends of the second arms, and wherein the length of the first arm is equal to the length of the second arm, and the ratio of the angle of rotation of the first arm with respect to the baseplate to the angle of rotation of the second arm with respect to the first arm is 1 to 2.

9. In the integrated module multi-chamber vacuum processing system according to claim 8, the substrate mechanical hand comprising pawls disposed on one surface which advance and retract by the operation of an electromagnetic actuator.

10. In an integrated module multi-chamber vacuum processing system for processing substrates, the system comprising a plurality of processing chambers, a substrate transferring chamber, at least one load-lock chamber and a substrate transferring robot assembly, a method of exchanging a processed substrate with an unprocessed substrate comprising the steps of:
   after a thin film deposition process is completed, opening a gate valve of a processing chamber;
   removing a processed substrate from the processing chamber by the use of a substrate mechanical hand of the substrate transferring robot assembly;
   placing the removed substrate on a first waiting stage of the substrate transferring robot assembly;
   grasping, using the substrate mechanical hand, an unprocessed substrate placed on a second waiting stage of the substrate transferring robot assembly;
   transferring the unprocessed substrate into the processing chamber; and
   closing the gate valve of the processing chamber.

11. The method according to claim 10, wherein the step of removing the processed substrate comprises the steps of:
   grasping the processed substrate with the substrate mechanical hand; and
   moving the substrate mechanical hand in a straight line from the processing chamber to the waiting stage.

12. The method according to claim 10, wherein the step of transferring the unprocessed substrate comprises the step of moving the unprocessed substrate along a straight line from the second waiting stage to the processing chamber.

13. The method according to claim 10, further comprising the steps of:

while film is being deposited in the processing chamber, moving a baseplate of the substrate transferring robot assembly so that a carrying robot of the substrate transferring robot assembly is directed toward a load-lock chamber;

opening a gate valve of the load-lock chamber;

transferring the processed substrate placed on the second waiting stage to the load-lock chamber;

removing an unprocessed substrate from the load-lock chamber to place it on the first waiting stage;

closing the gate valve of the load-lock chamber; and rotating the baseplate toward the processing chamber into a stand-by state.

14. The method according to claim 13, wherein the step of transferring the processed substrate to the load-lock chamber comprises moving the substrate mechanical hand along a straight line from the second waiting stage to the load-lock chamber.

15. The method according to claim 13, wherein the step of removing an unprocessed substrate from the load-lock chamber to the first waiting stage comprises moving the substrate mechanical hand along a straight line from the load-lock chamber to the first holding stage.

16. The method according to claim 10, wherein the step of placing an unprocessed substrate on the another waiting stage comprises the steps of:

after one of the load-lock chambers is exposed to the atmosphere, opening a gate valve of the load-lock chamber to transfer to a substrate into the load-lock chamber;

closing the gate valve to evacuate the load-lock chamber;

rotating a baseplate of the substrate transferring robot assembly so that the substrate transferring robot assembly within the substrate transferring chamber faces the load-lock chamber;

opening a second gate valve of the load-lock chamber;

removing the substrate from the load-lock chamber by the substrate mechanical hand and placing the substrate on the another second waiting stage;

closing the second gate valve;

rotating the baseplate so that the substrate transferring robot assembly is directed toward one of the processing chambers.

* * * * *